US011175474B2

United States Patent
Oyama

(10) Patent No.: US 11,175,474 B2
(45) Date of Patent: Nov. 16, 2021

(54) LENS BARREL

(71) Applicant: CANON KABUSHIKI KAISHA, Tokyo (JP)

(72) Inventor: Yuki Oyama, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 292 days.

(21) Appl. No.: 16/383,345

(22) Filed: Apr. 12, 2019

(65) Prior Publication Data

US 2019/0317296 A1 Oct. 17, 2019

(30) Foreign Application Priority Data

Apr. 17, 2018 (JP) .............................. JP2018-079134

(51) Int. Cl.
| G02B 7/10 | (2021.01) |
| G02B 7/04 | (2021.01) |
| G02B 7/02 | (2021.01) |
| H04N 5/225 | (2006.01) |
| H05K 1/02 | (2006.01) |

(52) U.S. Cl.
CPC ............. *G02B 7/023* (2013.01); *G02B 7/102* (2013.01); *H04N 5/2254* (2013.01); *H05K 1/028* (2013.01); *G02B 7/04* (2013.01)

(58) Field of Classification Search
CPC .............................................. G02B 7/02–7/16
USPC .......................................... 396/542; 359/819
See application file for complete search history.

(56) References Cited

U.S. PATENT DOCUMENTS

| 4,864,348 | A | * | 9/1989 | Fujiwara | ................ | G03B 17/00 396/542 |
| 4,951,083 | A | * | 8/1990 | Okura | .................... | G03B 17/02 396/529 |
| 5,559,571 | A | * | 9/1996 | Miyamoto | ............... | G03B 5/00 396/52 |
| 5,581,412 | A | * | 12/1996 | Tanaka | .................... | G02B 7/10 359/697 |
| 5,644,440 | A | * | 7/1997 | Akada | ...................... | G02B 7/08 359/694 |
| 5,655,171 | A | * | 8/1997 | Machida | ................ | G03B 17/02 396/535 |
| 5,708,535 | A | * | 1/1998 | Orimo | ................... | G02B 7/102 359/823 |

(Continued)

FOREIGN PATENT DOCUMENTS

| CN | 101051108 A | 10/2007 |
| CN | 101523893 A | 9/2009 |

(Continued)

*Primary Examiner* — Zachary W Wilkes
(74) *Attorney, Agent, or Firm* — Canon U.S.A., Inc. I.P. Division

(57) ABSTRACT

A lens barrel includes a plurality of lens moving frames configured to move in an optical axis direction, a drive unit provided to each of the plurality of lens moving frames and configured to move a corresponding one of the plurality of lens moving frames in the optical axis direction, an iris unit configured to move in an integrated manner with a first lens moving frame among the plurality of lens moving frames, and a flexible printed circuit board connected to the iris unit, wherein the flexible printed circuit board is disposed on one side of sides divided by a plane passing through an optical axis, and the drive unit is disposed on other side of the sides divided by the plane passing through the optical axis.

4 Claims, 6 Drawing Sheets

(56) References Cited

U.S. PATENT DOCUMENTS

| | | | | |
|---|---|---|---|---|
| 5,717,969 A * | 2/1998 | Miyamoto | ............... | G02B 7/08 |
| | | | | 396/535 |
| 5,758,208 A * | 5/1998 | Fujii | ....................... | G03B 5/00 |
| | | | | 396/542 |
| 5,784,206 A * | 7/1998 | Nomura | .................... | G02B 7/08 |
| | | | | 359/698 |
| 5,826,126 A * | 10/1998 | Nomura | .................... | G02B 7/08 |
| | | | | 396/542 |
| 7,551,369 B2 * | 6/2009 | Tomita | ................... | G02B 7/102 |
| | | | | 359/703 |
| 7,586,519 B2 * | 9/2009 | Nomura | ................. | G03B 17/04 |
| | | | | 348/208.4 |
| 7,604,421 B2 * | 10/2009 | Tanaka | ................... | G03B 17/02 |
| | | | | 396/462 |
| 7,899,312 B2 * | 3/2011 | Iijima | .................. | G02B 27/646 |
| | | | | 396/55 |
| 7,934,875 B2 * | 5/2011 | Kakuta | ................ | H04N 5/2254 |
| | | | | 396/349 |
| 8,366,329 B2 * | 2/2013 | Lee | ........................ | G03B 17/00 |
| | | | | 396/349 |
| 2007/0019950 A1 | 1/2007 | Tanaka | | |
| 2007/0189766 A1 * | 8/2007 | Kuwahara | .............. | G03B 17/02 |
| | | | | 396/542 |
| 2011/0043684 A1 * | 2/2011 | Fujita | ..................... | G02B 7/102 |
| | | | | 348/374 |

FOREIGN PATENT DOCUMENTS

| | | | |
|---|---|---|---|
| CN | 105842955 A | | 8/2016 |
| JP | H06-034869 A | | 2/1994 |
| JP | 2587883 Y2 | * | 12/1998 |
| JP | 2004-264782 A | | 9/2004 |
| JP | 2007-33699 A | | 2/2007 |
| JP | 2008-090273 A | | 4/2008 |

* cited by examiner

WIDE ANGLE POSITION

TELEPHOTO POSITION

LENS BARREL

BACKGROUND OF THE INVENTION

Field of the Invention

The present invention relates to a lens barrel, and more particularly to a lens barrel that performs zoom driving.

Description of the Related Art

Monitoring cameras have been installed in various places such as towns, ports, and stadiums, and are used to monitor suspicious individuals, for example. Examples of the monitoring cameras include a rotation camera capable of panning and tilting. In the rotation camera, there is a demand for high magnification and high-accuracy zoom driving in every image capturing direction.

An ordinary lens barrel included in a camera, such as a monitoring camera, is configured in such a manner that a plurality of moving lens groups is fitted on a guide bar to move in an optical axis direction within the lens barrel. The plurality of moving lens groups includes a zoom moving lens group, and the zoom moving lens group may include an iris mechanism for adjusting an amount of light incident on the zoom moving lens group, and a movable flexible printed circuit (FPC, or a flexible printed circuit board) electrically connected to the iris mechanism. With such a configuration, this type of lens barrel achieves high magnification while reducing the size of an apparatus.

However, in the case of the zoom moving lens group including the iris mechanism, an arrangement of the movable FPC connected to the iris mechanism is changed together with the iris mechanism to match with the optical arrangement of the zoom moving lens group. Consequently, a flexible portion of the movable FPC is repeatedly bent.

Thus, in a case where the camera operates continuously for a long time like a monitoring camera, the flexible portion of the movable FPC repeatedly receives a bending load. This may result in deterioration in the electrical connection performance.

In view of such a situation, Japanese Patent Application Laid-Open No. 2007-33699 discusses a technique, in which a flexible printed circuit board included in a shutter unit which is driven integrally with a lens is bent in a direction parallel with an optical axis in such a manner that a curvature radius of the flexible printed circuit board is maintained substantially constant along the front side or the rear side of the shutter unit. This technique reduces a lens driving load and also reduces a size of an apparatus.

However, according to the technique discussed in Japanese Patent Application Laid-Open No. 2007-33699, in a case where a movement amount of the shutter unit in the optical axis direction is large, a load applied near a fixed portion may become large because the flexible printed circuit board curves around and is fixed to the shutter unit. In addition, because a space for the flexible printed circuit board curving around the shutter unit is need at a side-face portion of the shutter unit, the size of the lens barrel may increase if a sleeve of another moving lens group is disposed in the side-face portion of the shutter unit.

SUMMARY OF THE INVENTION

The present invention is directed to providing a small lens barrel, while durability of a movable flexible printed circuit (FPC) of an iris mechanism is ensured even in a case where a plurality of moving lens groups is provided and a zoom moving lens group includes the iris mechanism.

According to an aspect of the present invention, a lens barrel includes a plurality of lens moving frames configured to move in an optical axis direction, a drive unit provided to each of the plurality of lens moving frames and configured to move a corresponding one of the plurality of lens moving frames in the optical axis direction, an iris unit configured to move in an integrated manner with a first lens moving frame among the plurality of lens moving frames, and a flexible printed circuit board connected to the iris unit, wherein the flexible printed circuit board is disposed on one side of sides divided by a plane passing through an optical axis, and the drive unit is disposed on other side of the sides divided by the plane passing through the optical axis.

Further features of the present invention will become apparent from the following description of exemplary embodiments with reference to the attached drawings.

DESCRIPTION OF THE EMBODIMENTS

Exemplary embodiments of the present invention will be described in detail below with reference to the attached drawings.

Figure 1A:
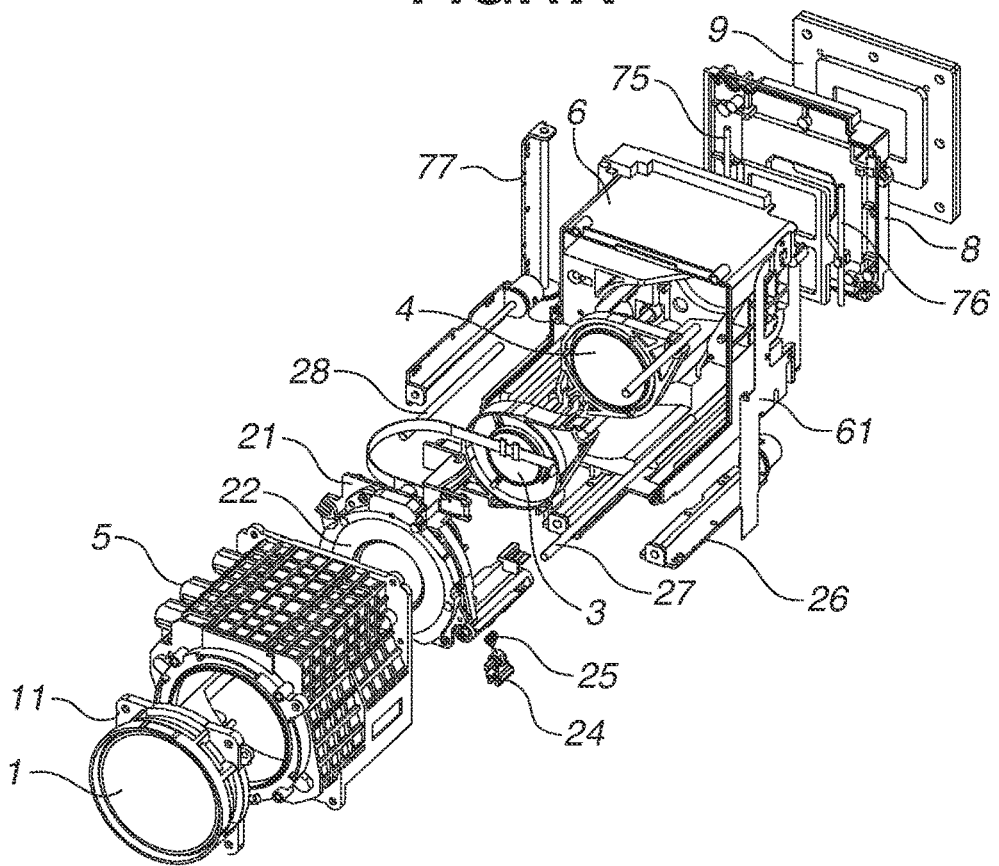
FIGS. 1A and 1B are diagrams each illustrating an exploded perspective view of a lens barrel according to an exemplary embodiment of the present invention.
Figure 1B:
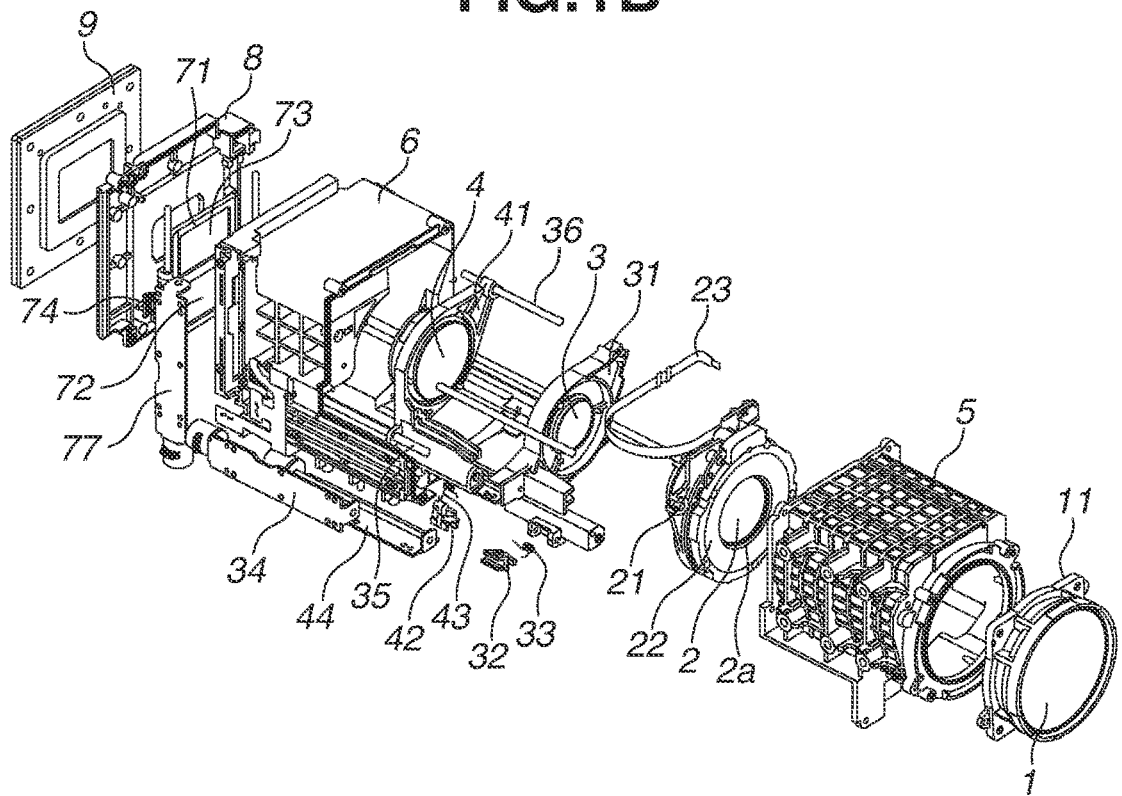

FIGS. 1A and 1B are diagrams each illustrating an exploded perspective view of a lens barrel according to an exemplary embodiment of the present invention. The lens barrel according to the present exemplary embodiment includes one fixed lens and three moving lenses. The fixed lens is a first group lens 1, and the moving lenses are a second group lens 2, a third group lens 3, and a fourth group lens 4. The first group lens 1 is fixed in an optical axis direction. The second group lens 2 performs a scaling operation by moving in the optical axis direction. The third group lens 3 performs a focusing operation by moving in the optical axis direction. The fourth group lens 4 performs a scaling operation by moving in the optical axis direction.

A first group lens fixing frame 11 holds the first group lens 1, and is fixed to a front side holding barrel 5. A second group lens moving frame 21 holds the second group lens 2, and serves as an example of a first lens moving frame. The second group lens moving frame 21 is supported by a second group guide bar 27 movably in the optical axis direction. Further, the second group lens moving frame 21 has a groove portion engaged with a second group swing stopping bar 28 to prevent the second group lens moving frame 21 from rotating around the second group guide bar 27. The second group guide bar 27 and the second group swing stopping bar 28 are fixed between the front side holding barrel 5 and a rear side holding barrel 6. The second group guide bar 27 and the second group swing stopping bar 28 are an example of a pair of second guide bars.

An iris unit 22 is fixed to the second group lens moving frame 21, and adjusts the amount of light to be incident on an imaging element 9. The iris unit 22 freely changes the opening diameter of an opening 2a formed by iris blades (not illustrated), by changing the input of an electrical signal. The iris unit 22 can thus adjust the amount of the incident light.

A movable flexible printed circuit (FPC) 23 is connected to the iris unit 22. The movable FPC 23 is provided to transmit an electrical signal from outside, and serves as an example of a flexible printed circuit board. The movable FPC 23 extends from the inside of the lens barrel to the outside of the rear side holding barrel 6, and is connected to an external power supply. The movable FPC 23 has a rectangular shape. One end side of the movable FPC 23 is fixed to the iris unit 22, and the other end side is held by the rear side holding barrel 6.

A rack 24 is fixed to the second group lens moving frame 21 in such a state that the rack 24 is biased by a biasing spring 25 in the optical axis direction and a rotation direction. The rack 24 is engaged with a screw portion of a stepping motor 26. The second group lens moving frame 21 is driven in the optical axis direction via the rack 24 by the rotation of the screw portion of the stepping motor 26. The stepping motor 26 is fixed to the rear side holding barrel 6. The stepping motor 26 as well as stepping motors 34 and 44 each serve as an example of a drive unit, and are provided to correspond to the second group lens moving frame 21, a third group lens moving frame 31, and a fourth group lens moving frame 41, respectively.

The third group lens moving frame 31 holds the third group lens 3 and serves as an example of a second lens moving frame. The third group lens moving frame 31 is supported movably in the optical axis direction, by a common guide bar 35 that is common to the fourth group lens moving frame 41 to be described below. The third group lens moving frame 31 has a groove portion engaged with a common swing stopping bar 36 that is common to the fourth group lens moving frame 41 to be described below. Thus, the third group lens moving frame 31 is prevented from rotating around the common guide bar 35. The common guide bar 35 and the common swing stopping bar 36 are fixed between the front side holding barrel 5 and the rear side holding barrel 6. The common guide bar 35 and the common swing stopping bar 36 are an example of a pair of first guide bars.

A rack 32 is fixed to the third group lens moving frame 31 in such a state that the rack 32 is biased by a biasing spring 33 in the optical axis direction and the rotation direction. The rack 32 is engaged with a screw portion of the stepping motor 34. The third group lens moving frame 31 is driven in the optical axis direction via the rack 32, by the rotation of the screw portion of the stepping motor 34. The stepping motor 34 is fixed to the rear side holding barrel 6.

The fourth group lens moving frame 41 holds the fourth group lens 4 and serves as an example of a third lens moving frame. The fourth group lens moving frame 41 is supported movably in the optical axis direction by the common guide bar 35. The fourth group lens moving frame 41 has a groove portion engaged with the common swing stopping bar 36. Thus, the fourth group lens moving frame 41 is prevented from rotating around the common guide bar 35.

A rack 42 is fixed to the fourth group lens moving frame 41 in such a state that the rack 42 is biased by a biasing spring 43 in the optical axis direction and the rotation direction. The rack 42 is engaged with a screw portion of the stepping motor 44. The fourth group lens moving frame 41 is driven in the optical axis direction via the rack 42 by the rotation of the screw portion of the stepping motor 44. The stepping motor 44 is fixed to the rear side holding barrel 6.

Figure 2:
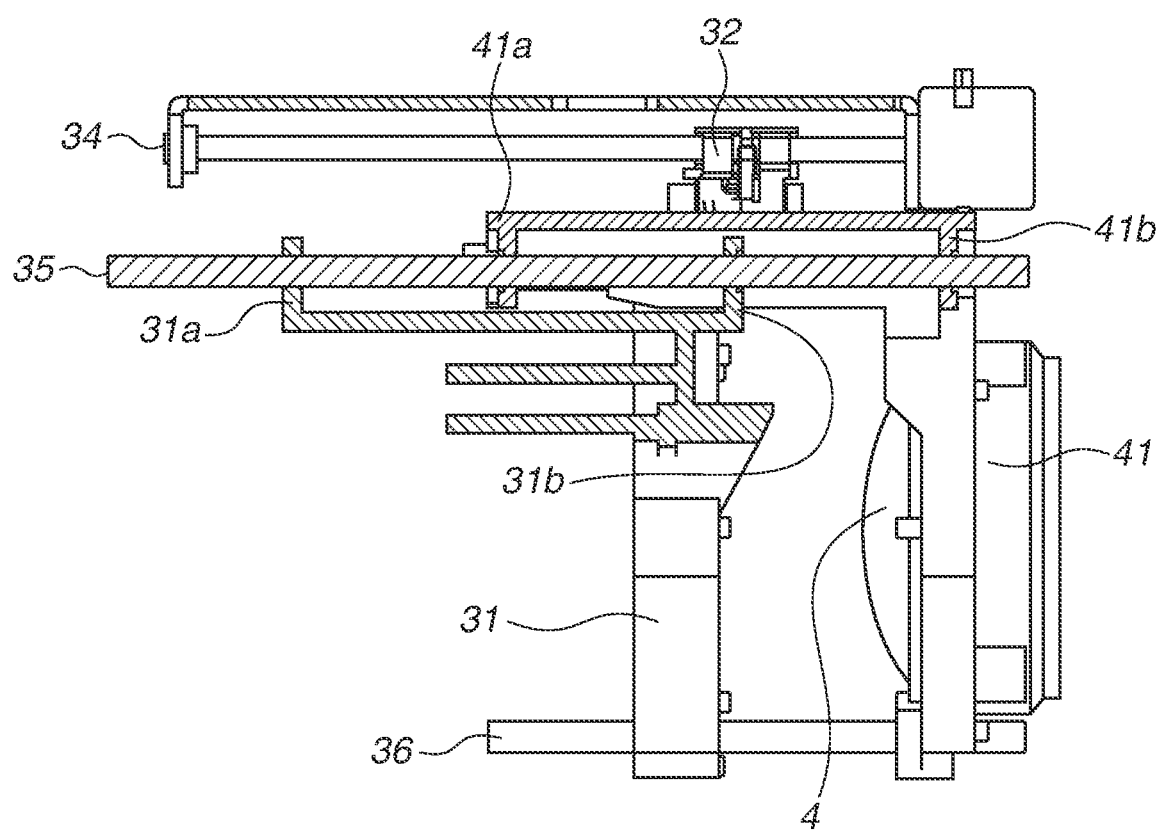
FIG. 2 is a cross-sectional view of lens moving frames supported by a same guide bar according to the exemplary embodiment of the present invention.

FIG. 2 is a diagram illustrating a state where the third group lens moving frame 31 and the fourth group lens moving frame 41 are engaged with the common guide bar 35.

The third group lens moving frame 31 has two fitting portions that are a first third group fitting portion 31a and a second third group fitting portion 31b, with respect to the common guide bar 35.

The fourth group lens moving frame 41 has two fitting portions that are a first fourth group fitting portion 41a and a second fourth group fitting portion 41b, with respect to the common guide bar 35. The first third group fitting portion 31a and the second third group fitting portion 31b are fit on the common guide bar 35 in a manner such that the first fourth group fitting portion 41a is interposed between the first third group fitting portion 31a and the second third group fitting portion 31b. Similarly, the first fourth group fitting portion 41a and the second fourth group fitting portion 41b are fit on the common guide bar 35 in a manner such that the second third group fitting portion 31b is interposed between the first fourth group fitting portion 41a and the second fourth group fitting portion 41b. In other words, on the common guide bar 35 (on the same first common guide), one of the two fitting portions of the third group lens moving frame 31 is disposed between the two fitting portions of the fourth group lens moving frame 41. On the common guide bar 35 (on the same first common guide) One of the two fitting portions of the fourth group lens moving frame 41 is disposed between the two fitting portions of the third group lens moving frame 31.

In this way, because the third group lens moving frame 31 and the fourth group lens moving frame 41 are supported by the common guide bar 35, the lens barrel can be reduced in size, as compared with a case where guide bars are separately provided. In addition, the sleeve of each of the third group lens moving frame 31 and the fourth group lens moving frame 41 can be increased in length, so that the orientation of each of the third group lens moving frame 31 and the fourth group lens moving frame 41 can be stabilized.

A filter holding frame 71 holds an infrared cut filter 72 and a glass filter 73. The filter holding frame 71 is supported movably in a direction perpendicular to the optical axis, by a guide bar 75. The filter holding frame 71 has a groove portion engaged with a swing stopping bar 76, so that the filter holding frame 71 is prevented from rotating around the guide bar 75. The guide bar 75 and the swing stopping bar 76 are fixed between the rear side holding barrel 6 and a sensor holding frame 8.

A rack 74 is fixed to the filter holding frame 71 in such a state that the rack 74 is biased by a biasing spring (not illustrated) in the direction perpendicular to the optical axis and the rotation direction. The rack 74 is engaged with a screw portion of a stepping motor 77. The filter holding frame 71 is driven in the direction perpendicular to the optical axis via the rack 74, by the rotation of the screw portion of the stepping motor 77. The stepping motor 77 is fixed to the rear side holding barrel 6.

In an image capturing mode referred to as a night mode in which infrared light is not cut, the infrared cut filter 72 retracts from an optical path. Thus, the infrared light is collected in addition to visible light. This enables satisfactory object image capturing even at night. In an image capturing mode referred to as a day mode in which the infrared cut filter 72 is inserted on the optical path and the visible light is collected. Thus, daytime object image capturing can be performed.

A lens FPC 61 is connected to the stepping motors 26, 34, 44, and 77, and activates each of these motors by energization. A photo interrupter (not illustrated) is fixed to the lens FPC 61 to detect the position of each of the second group lens moving frame 21, the third group lens moving frame 31, and the fourth group lens moving frame 41 in the optical axis direction. The sensor holding frame 8 holds the imaging element 9 and is fixed to the rear side holding barrel 6.

Figure 3:
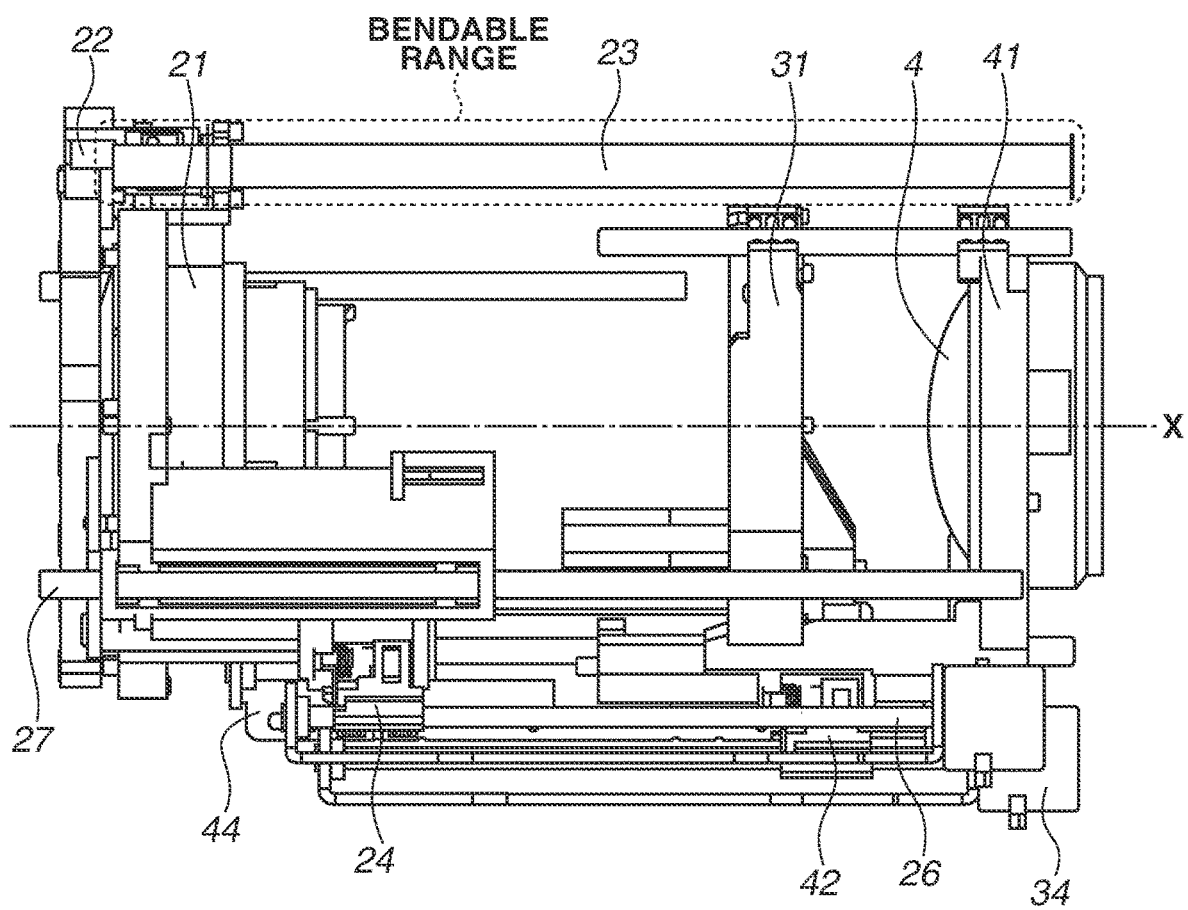
FIG. 3 is a side view of the inside of the lens barrel according to the exemplary embodiment of the present invention.
Figure 4:
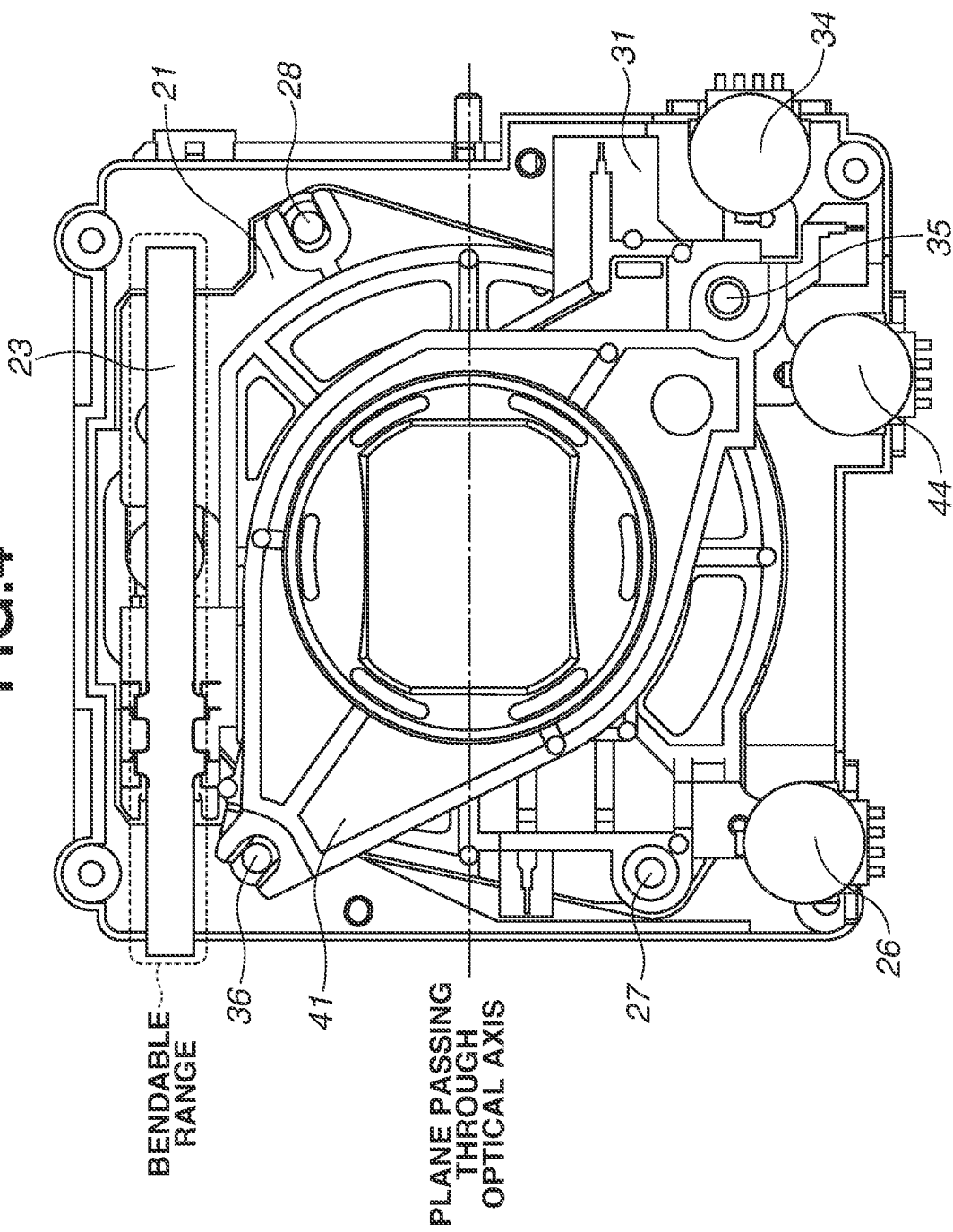
FIG. 4 is a view of the inside of the lens barrel according to the exemplary embodiment of the present invention as viewed from the imaging element side.

FIG. 3 is a side view of the inside of the lens barrel according to the exemplary embodiment of the present invention. FIG. 4 is a view of the inside of the lens barrel according to the exemplary embodiment of the present invention as viewed from the imaging element side.

As described above, the movable FPC 23 is provided to transmit an electrical signal from outside to the iris unit 22. Further, the movable FPC 23 can bend around an axis orthogonal to the optical axis.

The imaging element side of the movable FPC 23 is fixed to the rear side holding barrel 6. Thus, as illustrated in FIG. 3, when the second group lens moving frame 21 is moved toward the object side to the maximum, the movable FPC 23 is in the longest extended state in the optical axis direction. This is a state where the movable FPC 23 has the smallest curve. Further, as illustrated in FIG. 4, when the second group lens moving frame 21 is moved toward the imaging element side to the maximum, the movable FPC 23 is in the longest extended state in the direction perpendicular to the optical axis. This is a state where the movable FPC 23 has the largest curve.

As illustrated in FIG. 4, the movable FPC 23 is disposed on one side resulting from division by a plane passing thorough the optical axis. Further, the stepping motors 26, 34, and 44 are disposed on the other side resulting from the division by the plane passing thorough the optical axis.

The movable FPC 23 forms a sufficiently gentle bend in the inside of the lens barrel, which is desirable in terms of durability. According to the present exemplary embodiment, the movable FPC 23 and the stepping motors 26, 34, and 44 are disposed at the above-described positions, and thus, the stepping motors 26, 34, and 44 do not disturb the movement of the movable FPC 23. More specifically, the movable FPC 23 can ensure a sufficiently gentle bending state, and thus, can enhance the durability.

Further, the second group lens moving frame 21, the third group lens moving frame 31, and the fourth group lens moving frame 41 are driven to move straight in the optical axis direction via the racks 24, 32, and 42 by the rotation of the screw portions of the stepping motors 26, 34, and 44. Thus, the racks 24, 32, and 42 need to have the respective lengths that cover travel distances that are necessary for the second group lens moving frame 21, the third group lens moving frame 31, and the fourth group lens moving frame 41, for zooming and focusing. Furthermore, the racks 24, 32, and 42 also move in the optical axis direction by following the movement of the second group lens moving frame 21, the third group lens moving frame 31, and the fourth group lens moving frame 41. Thus, it is necessary to provide a space in front of and behind the racks 24, 32, and 42 in the optical axis direction. In such a space, it is difficult to dispose other member. However, according to the present exemplary embodiment, because the movable FPC 23 and the stepping motors 26, 34, and 44 are disposed at the above-described positions, a wasted space is small. This reduces the size of the lens barrel.

As described above, the lens barrel according to the present exemplary embodiment can reduce the size of the lens barrel while ensuring the durability of the movable FPC 23.

Figure 5:
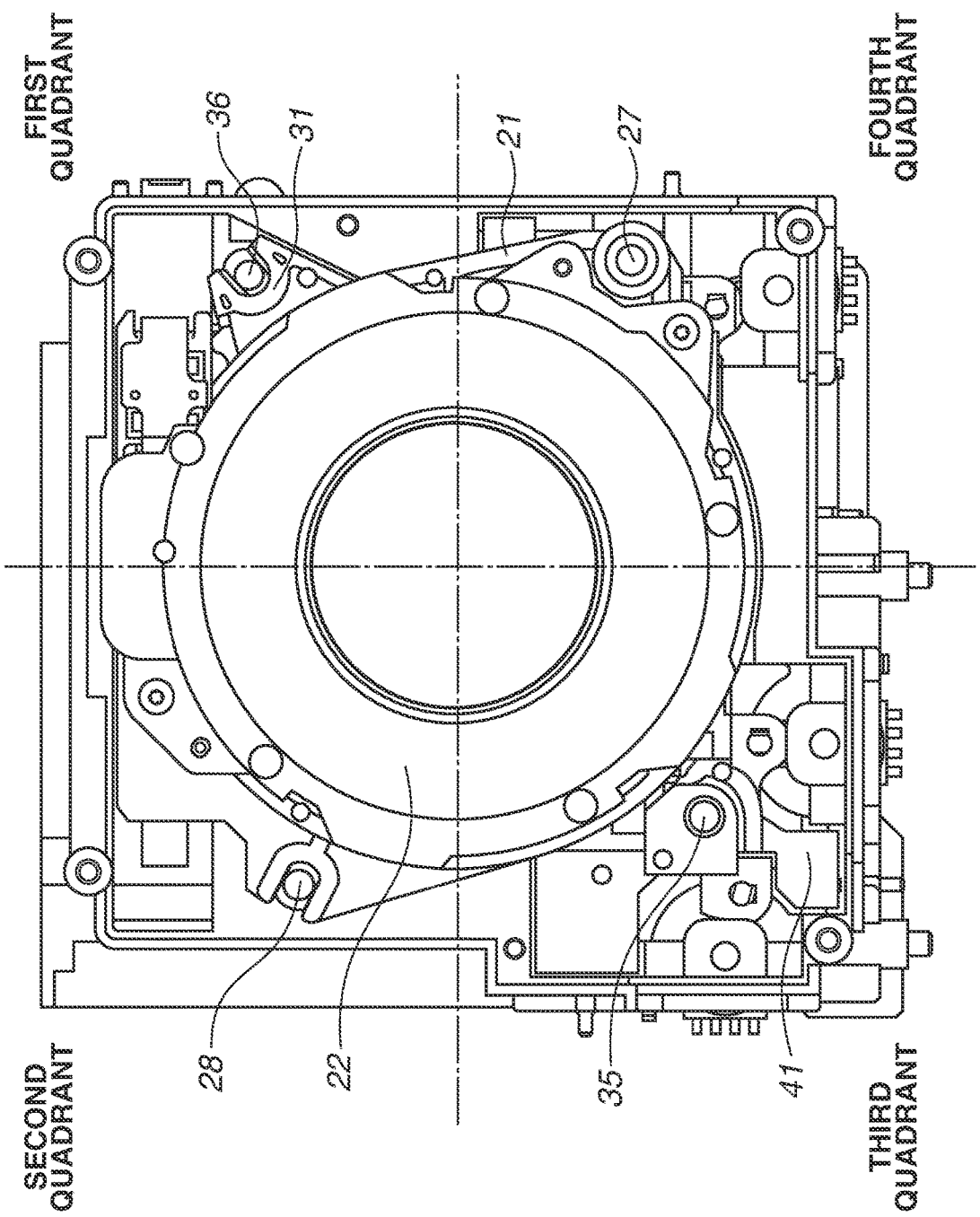
FIG. 5 is a view of the inside of the lens barrel according to the exemplary embodiment of the present invention as viewed from the object side.

A description will be given of an arrangement of the second group guide bar 27, the second group swing stopping bar 28, the common guide bar 35, and the common swing stopping bar 36. FIG. 5 is a view of the inside of the lens barrel according to the exemplary embodiment of the present invention as viewed from the object side.

As illustrated in FIG. 5, the iris unit 22 is substantially circular and is disposed inside the lens barrel that is substantially rectangular in the direction perpendicular to the optical axis. The second group guide bar 27, the second group swing stopping bar 28, the common guide bar 35, and the common swing stopping bar 36 are disposed in the respective quadrants in FIG. 5, inside of the lens barrel. In other words, the second group guide bar 27, the second group swing stopping bar 28, the common guide bar 35, and the common swing stopping bar 36 are each disposed in the corresponding one of four areas resulting from division by two lines orthogonal to the optical axis, as viewed from the optical axis direction. The third group lens moving frame 31 and the fourth group lens moving frame 41 are supported by the common guide bar 35 and the common swing stopping bar 36. Thus, the second group guide bar 27, the second group swing stopping bar 28, the common guide bar 35, and the common swing stopping bar 36 can be disposed in the respective quadrants.

In this way, according to the present exemplary embodiment, the second group guide bar 27, the second group swing stopping bar 28, the common guide bar 35, and the common swing stopping bar 36 that are long in the optical axis direction are disposed in the respective quadrants. Therefore, an increase in the size of the lens barrel is avoided.

Figure 6A:
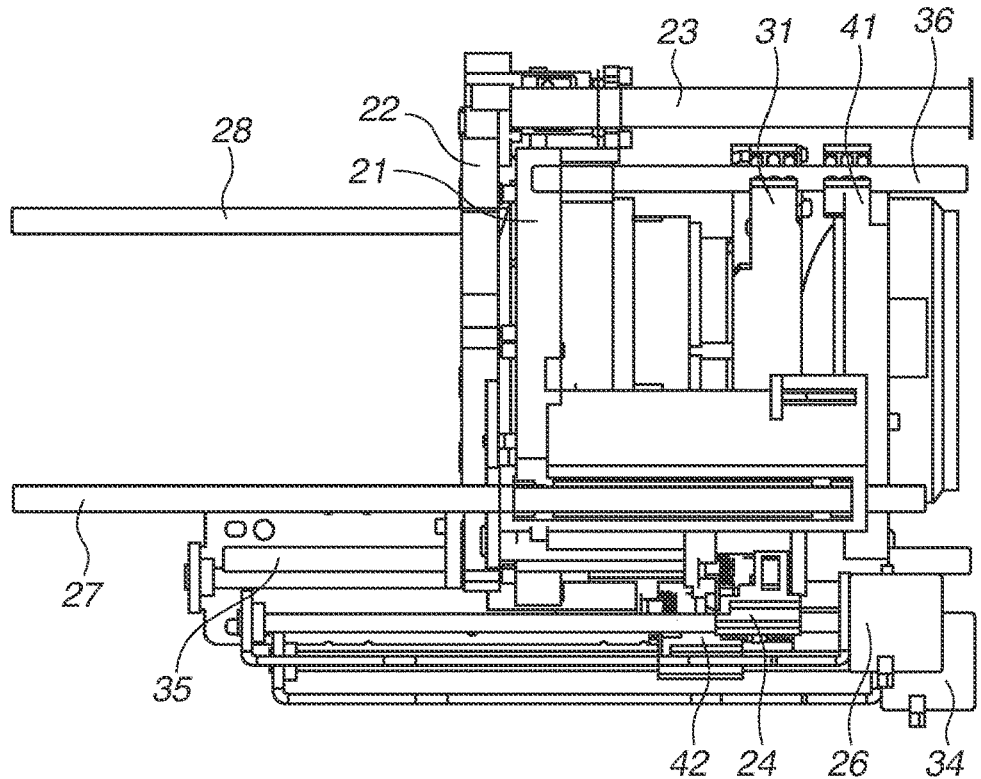
FIG. 6A is a diagram illustrating a lens arrangement in a wide angle state and FIG. 6B is a diagram illustrating a lens arrangement in a telephoto state, respectively, according to the exemplary embodiment of the present invention.

A description will be given of the relationship between a travel distance of each of the third group lens moving frame 31 and the fourth group lens moving frame 41 and a bendable range of the movable FPC 23. FIG. 6A is a diagram illustrating a lens arrangement in a wide angle state and FIG. 6B is a diagram illustrating a lens arrangement in a telephoto state, respectively, according to the exemplary embodiment of the present invention.

Figure 6B:
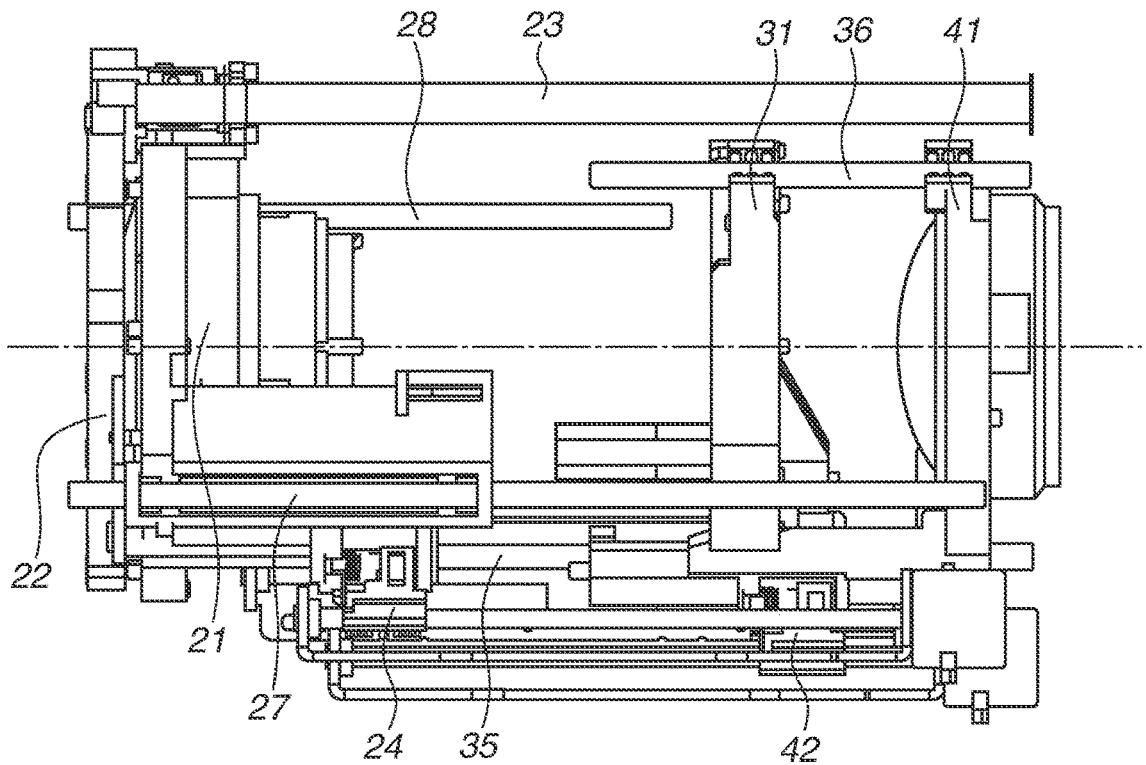

As illustrated in FIGS. 6A and 6B, the third group lens moving frame 31 and the fourth group lens moving frame 41 are each disposed at a position closer to the imaging element 9 than the iris unit 22 in the optical axis direction. Further, when a change from the wide angle state to the telephoto state occurs, the third group lens moving frame 31 and the fourth group lens moving frame 41 move in the optical axis direction within a range in which the movable FPC 23 is bendable, even if a change occurs in the arrangement of the lens moving frames 21, 31, and 41.

This can reduce the size of the lens barrel, while maximizing the bendable range of the movable FPC 23 in the optical axis direction.

Exemplary embodiments of the present invention are described above, but the present invention is not limited to these exemplary embodiments, and various alterations and modifications can be made within the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-079134, filed Apr. 17, 2018, which is hereby incorporated by reference herein in its entirety.

What is claimed is:

1. A lens barrel comprising:
    a first lens holding frame configured to movably hold a first lens in an optical axis direction;
    a second lens holding frame configured to movably hold a second lens in the optical axis direction;
    a third lens holding frame configured to movably hold a third lens in the optical axis direction;
    a first drive unit configured to move the first lens holding frame in the optical axis direction;
    a second drive unit configured to move the second lens holding frame in the optical axis direction;
    a third drive unit configured to move the third lens holding frame in the optical axis direction;
    an iris unit configured to move in an integrated manner with a first lens holding frame in the optical axis direction;
    a flexible printed circuit board connected to the iris unit; and
    a pair of first guide bars configured to support the second lens holding frame and the third lens holding frame movably in the optical axis direction,
    wherein the flexible printed circuit board is disposed on one side of sides divided by a plane passing through an optical axis, and the first drive unit, the second drive unit and the third drive unit are disposed on other side of the sides divided by the plane passing through the optical axis.

2. The lens barrel according to claim 1,
    wherein each of the second lens holding frame and the third lens holding frame has two fitting portions to be fit on the pair of first guide bars, and
    wherein, on the same first guide bar, one of the two fitting portions of the second lens holding frame is disposed between the two fitting portions of the third lens holding frame, and on the same first guide bar, one of the two fitting portions of the third lens holding frame is disposed between the two fitting portions of the second lens holding frame.

3. The lens barrel according to claim 1, further comprising
    a pair of second guide bars configured to support the first lens holding frame movably in the optical axis direction,
    wherein each guide bar of the pair of first guide bars and the pair of second guide bars is disposed in a different area of four areas divided by two lines orthogonal to the optical axis, as viewed from the optical axis direction.

4. The lens barrel according to claim 1,
    wherein the flexible printed circuit board is configured to be bent around an axis orthogonal to the optical axis,
    wherein the second lens holding frame and the third lens holding frame are each disposed at a position closer to an imaging element than the iris unit in the optical axis direction, and
    wherein the second lens holding frame and the third lens holding frame move in the optical axis direction within a range in which the flexible printed circuit board is bendable.

* * * * *